United States Patent [19]
Ruque

[11] Patent Number: 5,885,089
[45] Date of Patent: Mar. 23, 1999

[54] DRAWER FOR AUTOMATICALLY PLUGGABLE AND UNPLUGGABLE ELECTRONIC CARDS, A DRAWER AND A BAY THEREFOR, AND A METHOD OF REMOVING ELECTRONIC CARDS

[75] Inventor: Christian Ruque, Corbas, France

[73] Assignee: GEC Alsthom Transport SA, Paris, France

[21] Appl. No.: 784,510

[22] Filed: Jan. 17, 1997

[30] Foreign Application Priority Data

Jan. 19, 1996 [FR] France ................................. 96 00587

[51] Int. Cl.⁶ ...................................................... H01R 9/09
[52] U.S. Cl. .............................................................. 439/61
[58] Field of Search ................................. 439/59, 61, 65, 439/374, 377

[56] References Cited

U.S. PATENT DOCUMENTS 4,179,724  12/1979  Bonhomme .............................. 361/391
5,388,995   2/1995  Rudy et al. ................................ 439/61

FOREIGN PATENT DOCUMENTS

0710065A1  5/1996  European Pat. Off. .
3603643A1  8/1987  Germany .
WO9110343  7/1991  WIPO .

*Primary Examiner*—Khiem Nguyen
*Assistant Examiner*—Eugene G. Byrd
*Attorney, Agent, or Firm*—Sughrue, Mion, Zinn, Macpeak & Seas, PLLC

[57] ABSTRACT

A drawer for electronic cards, the electronic cards being connected to a mother board by card connectors, and the electronic cards being connected to output connectors, wherein the drawer is automatically pluggable and unpluggable and wherein the following are disposed successively from the back to the front of the drawer:

The output connectors being disposed inside a drawer support and secured a back face of the drawer support;

The electronic cards being disposed between the output connectors in back and the card connectors in front; and the mother board disposed close to the front face of the drawer.

8 Claims, 5 Drawing Sheets

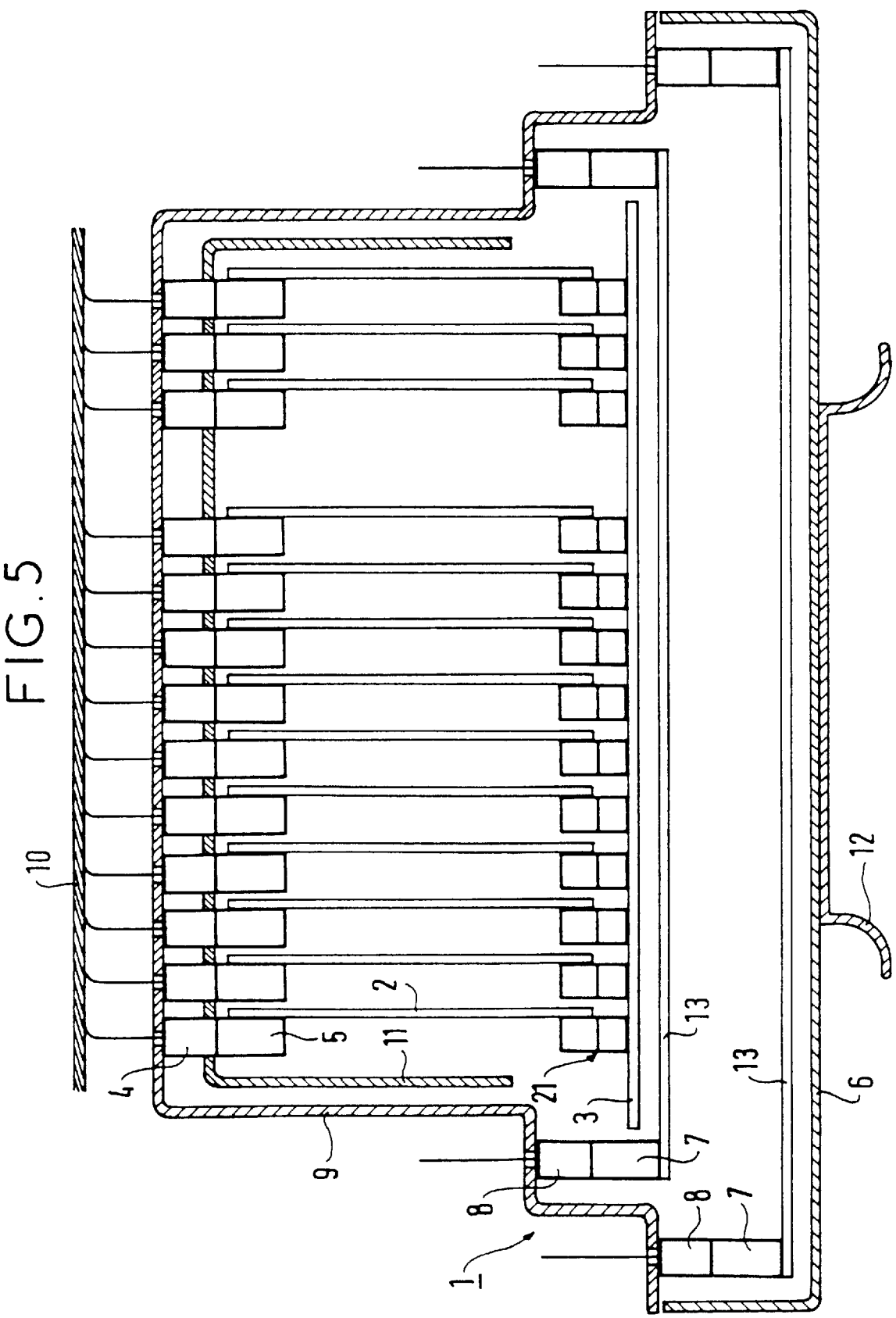

DRAWER FOR AUTOMATICALLY PLUGGABLE AND UNPLUGGABLE ELECTRONIC CARDS, A DRAWER AND A BAY THEREFOR, AND A METHOD OF REMOVING ELECTRONIC CARDS

The present invention relates to electronic card support assemblies in general, and more particularly to a drawer for automatically pluggable and unpluggable electronic cards, to a drawer together with a bay therefor, and also to a method of removing electronic cards.

BACKGROUND OF THE INVENTION

In the state of the art, daughter cards in an electronic card drawer are independent and are mounted in the drawer from the front thereof.

At their back ends, the daughter cards have respective back connectors, and at their front ends they have respective front connectors.

The daughter cards are suitable for being plugged in manually into connectors disposed on a mother board at the back of the drawer.

The function of the mother board is to establish electrical connections between the daughter cards.

Once the daughter cards have been plugged in at the back of the drawer, loose cabling can be connected manually at the front of the drawer to the daughter cards by means of connectors provided with plugs.

An electronic card drawer having that architecture has the following drawbacks:

it requires quite a long time to extract the entire drawer since it is necessary to undo all of the connectors located at the front;

it occupies a large amount of volume because of the presence of the cable-engaging plugs, because a large amount of clearance space needs to be given to the cables and the plugs, and because of the extra amounts of cable length necessary for moving in that clearance;

each time a drawer is extracted, the cables at the front of the drawer are subjected to twisting which can give rise to the cabling being damaged during various operations of handling the drawer;

the front connectors need to be removed and test connectors placed on the front face of the drawer;

it can be difficult to see indicators disposed on the fronts of the daughter cards;

it is difficult to ground shielded cables because of the lack of room in the plugs and because the connections outside the plugs require considerable lengths of cable, thereby giving rise to high impedances; and high extra cost.

Document WO 91/10343 relates to a drawer for electronic cards, with the electronic cards being connected to a mother board by means of card connectors, and with the electronic cards being connected to output connectors.

Such a prior art drawer presents the same drawbacks as those mentioned above.

OBJECTS AND SUMMARY OF THE INVENTION

Thus, an object of the invention is to provide a drawer for automatically pluggable and unpluggable electronic cards suitable for adapting to new constraints on electronic architecture and for avoiding the drawbacks of state of the art drawers.

New constraints on electronic architecture means that it is desirable to avoid mixing so-called "clean" electrical signals with so-called "dirty" electrical signals.

The invention provides a drawer for electronic cards, said electronic cards being connected to a mother board by means of card connectors, and said electronic cards being connected to output connectors, wherein the drawer is automatically pluggable and unpluggable and wherein the following are disposed successively from the back to the front of said drawer:

said back output connectors disposed inside a drawer support and secured to the back face of said drawer support;

said electronic cards disposed between said back output connectors and said front card connectors; and said mother board disposed close to the front face of said drawer.

Said electronic cards disposed between said back output connectors and said front card connectors are suitable for being manually disconnected from the back of said mother board by virtue of the front card connectors.

According to another characteristic of the invention, said drawer is suitable for being inserted in a bay, in which:

output cabling is disposed at the back of said bay; and associated output connectors are disposed inside said bay and are secured to the back face of said bay.

The drawer and the bay therefor of the invention also satisfy the characteristic whereby said electronic cards are connected to, and disconnected to from, said output cabling by means of said associated output connectors via said back output connectors, said associated output connectors and said back output connectors facing one another, said electronic cards being connected to, and disconnected from, said associated output connectors simultaneously by plugging and unplugging said associated output connectors and said back output connectors.

The invention also provides a method of removing electronic cards connected to a mother board, wherein said electronic cards are connected to back output connectors, said electronic cards are suitable for being connected to, and disconnected from, said associated output connectors, simultaneously by plugging and unplugging said back output connectors and said electronic cards are suitable for being disconnected manually from the back of said mother board by means of said front card connectors.

An advantage of the drawer of the invention for automatically pluggable and unpluggable electronic cards is that it no longer requires front connectors to be disconnected, thereby achieving considerable time savings when removing the drawer.

Another advantage of the drawer of the invention for automatically pluggable and unpluggable electronic cards is that the volume it occupies is reduced to a minimum because the plugs, the clearance volume, and the extra cable lengths are all eliminated.

Another advantage of the drawer of the invention for automatically pluggable and unpluggable electronic cards is the absence of any risk of the cables and the connectors being damaged since the cabling and the connectors are no longer dismantled.

Another advantage of the drawer of the invention for automatically pluggable and unpluggable electronic cards is un-opposed visibility and accessibility to indicators and test points because of the absence of cables and connectors at the front face of the drawer.

Another advantage of the drawer of the invention for automatically pluggable and unpluggable electronic cards is unhindered accessibility to the electronic cards in the drawer because the cards are fixed mechanically while the drawer is removed from its support.

Another advantage of the drawer of the invention for automatically pluggable and unpluggable electronic cards is that it completely solves the problem of electromagnetic disturbances by using a drawer support that is conductive.

Another advantage of the drawer of the invention for automatically pluggable and unpluggable electronic cards is that there is no longer any problem in grounding shielded wires since the shielding of fixed cabling can be kept as short as possible relative to the connectors, and the shielding can be connected directly to the bay.

BRIEF DESCRIPTION OF THE DRAWINGS

Other objects, characteristics, and advantages of the invention appear on reading the following description of a preferred embodiment of the drawer for automatically pluggable and unpluggable electronic cards, and also of the method of removing electronic cards, which description is made with reference to the accompanying drawings, in which:

FIG. 5 is a plan view of a fourth embodiment of the drawer of the invention for automatically pluggable and unpluggable electronic cards in a bay therefor.

MORE DETAILED DESCRIPTION

Figure 1:
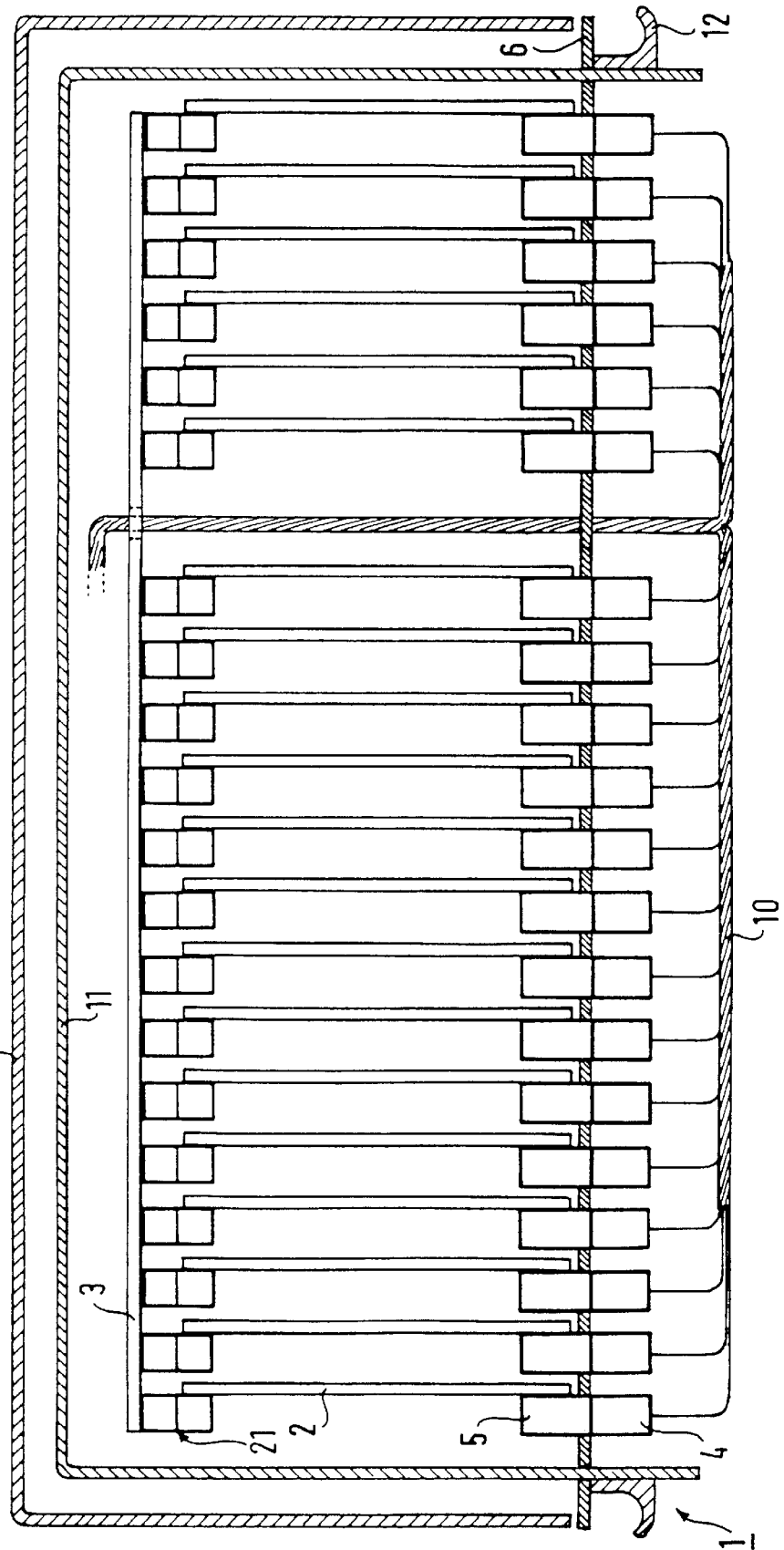
FIG. 1 is a plan view of a prior art drawer for electronic cards in place in a bay therefor.

FIG. 1 is a plan view of a prior art drawer for electronic cards and of the bay therefor.

The drawer shown in FIG. 1 is the drawer described above.

The drawer 1 for electronic cards 2 has so-called "daughter" electronic cards 2 connected to a mother board 3.

The electronic cards 2 are connected to the mother board 3 by means of card connectors 21.

The card connectors 21 enable the daughter cards 2 to be plugged manually while they are being inserted into the drawer.

The function of the card connectors 21 is to provide electrical connections between the daughter cards via the mother board 3.

The mother board 3 extends parallel to the back face of the support 11 of the drawer 1 and in the vicinity of said back face.

The electronic card drawer 1 has daughter cards 2 with front edges having output connectors 5 fixed thereto.

Associated output connectors 4 are suitable for being manually connected to the output connectors 5.

The associated output connectors 4 are secured to loose output cabling 10.

The output connectors 4 and 5 serve to make electrical connections between the daughter cards and the loose output cabling 10.

In the prior art, the drawer for electronic cards requires the mother board to be fixed at the back of the drawer.

The drawer for electronic cards also includes grip means 12 engaging the front face 6 of the drawer 1.

By way of example, the grip means 12 may be handles fixed to the front face 6 of the drawer or they may be windows formed therein.

The drawer 1 for electronic cards is put into place in and is fixed mechanically to a bay 9.

Figure 2:
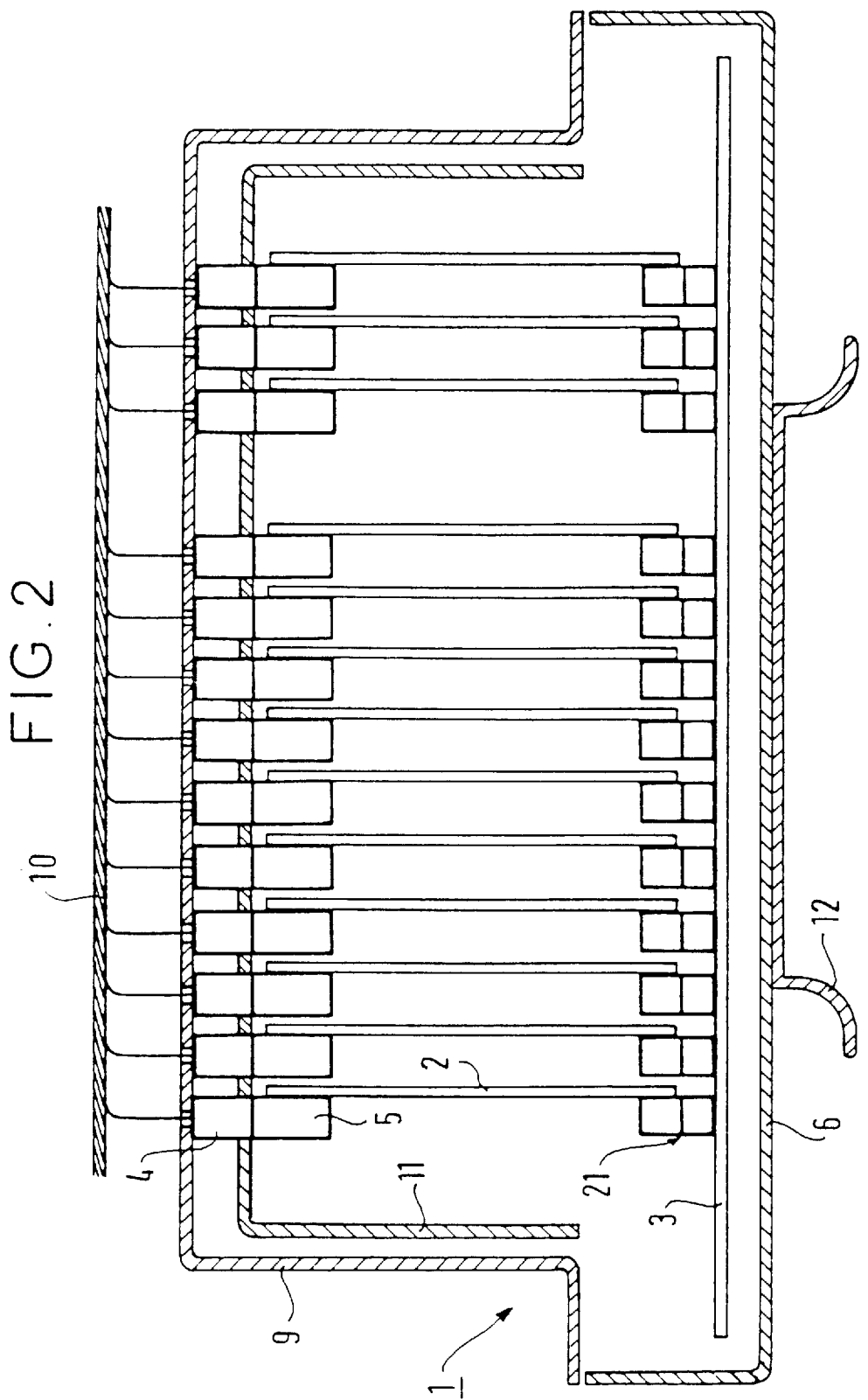
FIG. 2 is a plan view of a drawer of the invention for automatically pluggable and unpluggable electronic cards in place in a bay therefor.

FIG. 2 is a plan view of a drawer of the invention for automatically pluggable and unpluggable electronic cards, together with the bay therefor.

The drawer 1 for electronic cards 2 has electronic "daughter" cards 2 connected to a mother board 3.

The electronic cards 2 are connected manually to the mother board 3 by means of card connectors 21.

As mentioned above, the function of the card connectors 21 is to provide electrical connections between the daughter cards via the mother board 3.

The mother board 3 is disposed parallel to the front face 6 of the drawer 1.

The drawer 1 for electronic cards has daughter cards 2 with output connectors 5 on the back edges thereof.

Associated output connectors 4 are suitable for connecting automatically to the output connectors 5.

The associated output connectors 4 are secured to fixed output cabling 10.

The output connectors 4, 5 enable the daughter cards 3 to be plugged automatically on being engaged in the drawer.

As mentioned above, the function of the output connectors 4, 5 is to provide electrical connections between the daughter cards and the fixed output cabling 10.

The drawer of the invention for electronic cards requires the mother board to be fixed at the front of the drawer.

The drawer for electronic cards also includes grip means 12 secured to the front face 6 of the drawer 1.

By way of example, the grip means 12 are handles fixed to the front face 6 of the drawer 1 or windows formed therein.

The output connectors 5 are secured to the back face of the support 11 of the drawer 1.

The associated output connectors 4 connected to the fixed output cabling 10 are secured to the back face of the bay 9.

The front face 6 of the drawer 1 and the support 11 of the drawer are mechanically connected together so as to form a drawer of undeformable structure.

Figure 3:
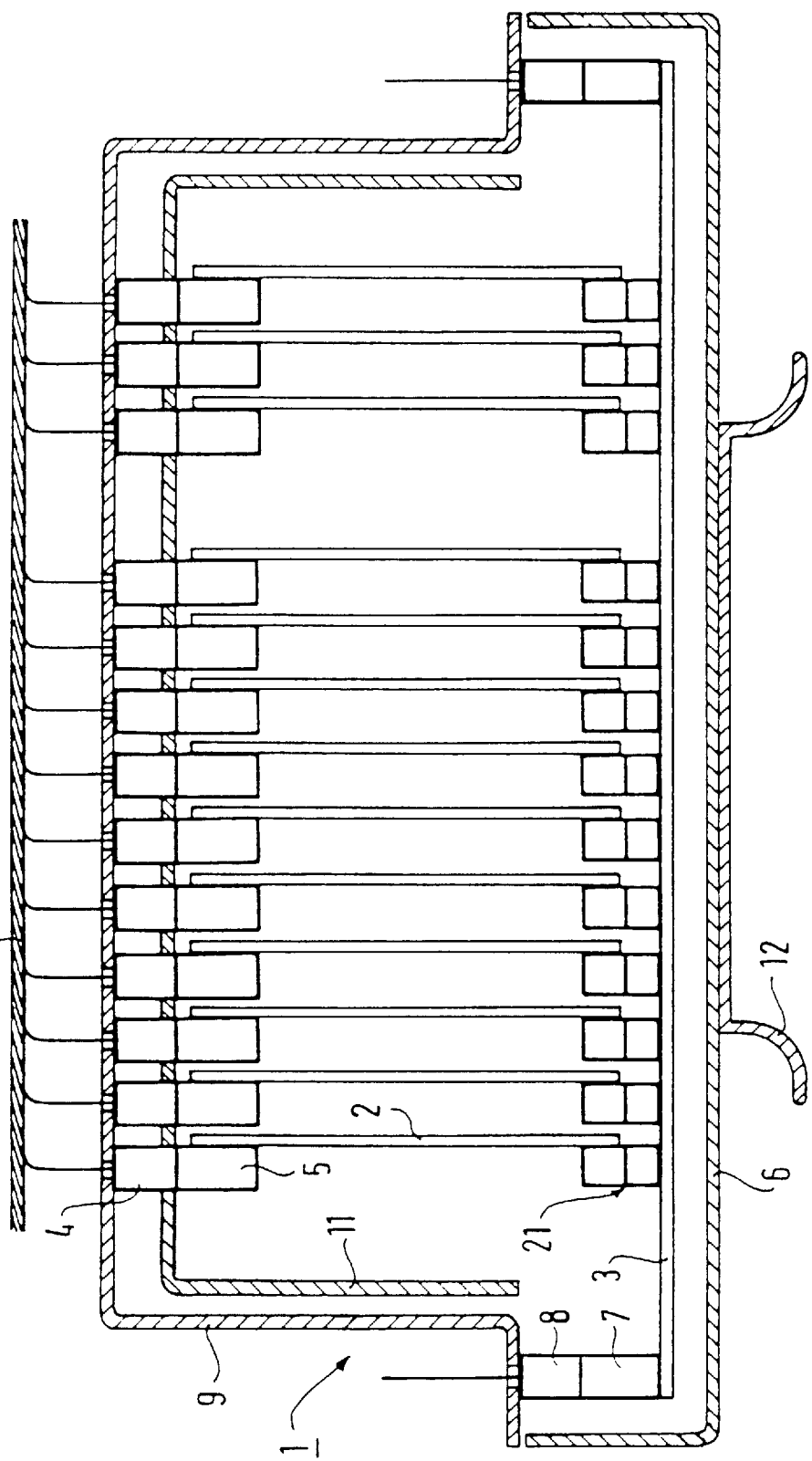
FIG. 3 is a plan view of a second embodiment of the drawer of the invention for automatically pluggable and unpluggable electronic cards in a bay therefor.

FIG. 3 is a plan view of a second embodiment of a drawer of the invention for automatically pluggable and unpluggable electronic cards.

The second embodiment of the drawer of the invention for automatically pluggable and unpluggable electronic cards, and the bay therefor are identical to the first embodiment of the drawer of the invention for automatically pluggable and unpluggable electronic cards and the support therefor.

In addition to the back output connectors 4, 5, the second embodiment of the drawer for automatically pluggable and unpluggable electronic cards also includes lateral output connectors 7, 8.

In this second embodiment, the mother board 3 extends beyond the daughter cards 2 on both sides and the free ends of the mother board are thus available for carrying output connectors 7, 8.

The fixed output connectors 8 are secured to the bay 9.

When the drawer with the daughter cards connected to the mother board is inserted into the bay therefor, the daughter cards are connected to the back output connectors 4 simultaneously with the mother board being connected to the lateral output connectors 8.

Figure 4:
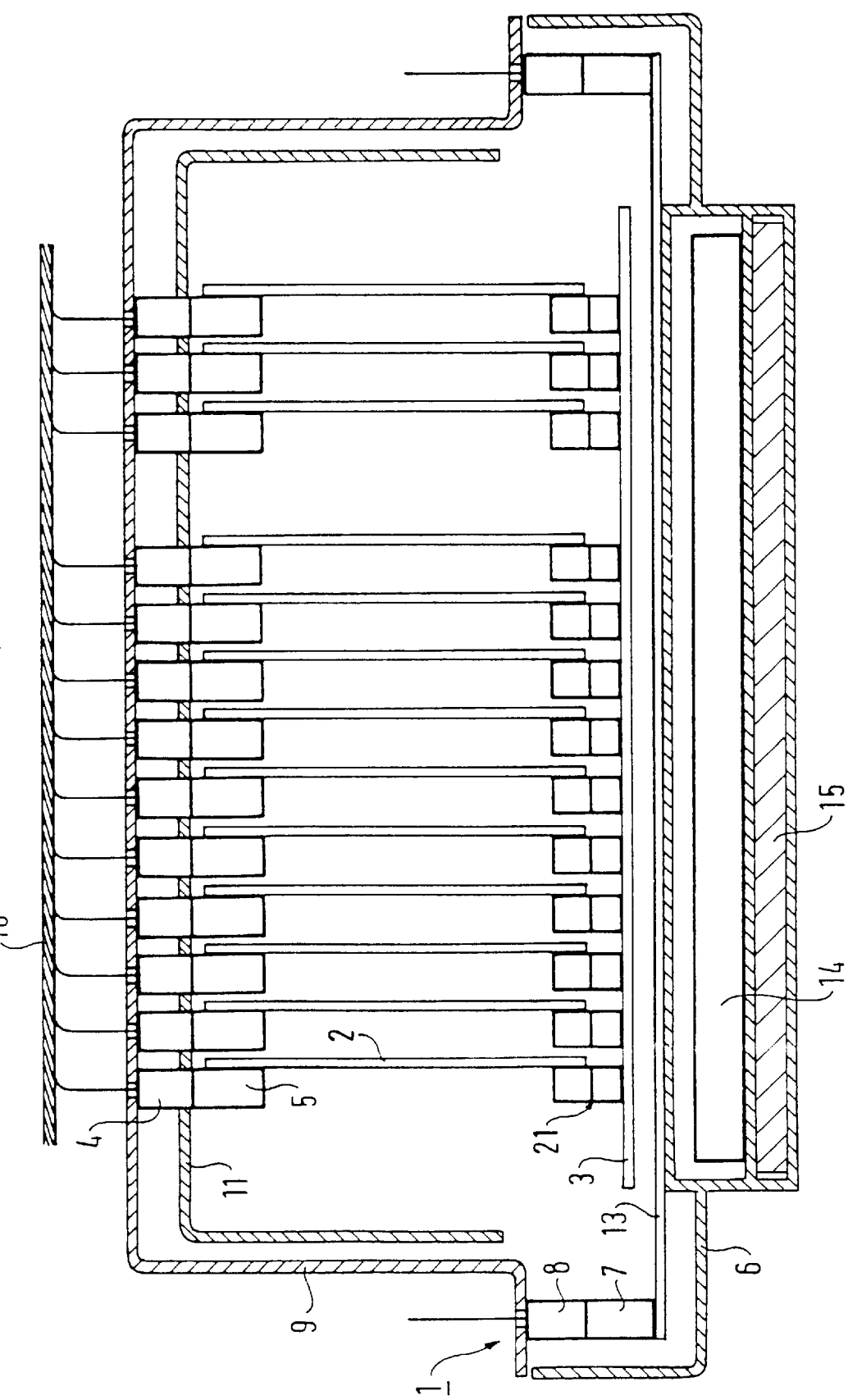
FIG. 4 is a plan view of a third embodiment of the drawer of the invention for automatically pluggable and unpluggable electronic cards in a bay therefor.

FIG. 4 is a plan view of a third embodiment of a drawer of the invention for automatically pluggable and unpluggable electronic cards and the bay therefor.

The third embodiment of the drawer of the invention for automatically pluggable and unpluggable electronic cards and the support therefor are identical to the first embodiment of the drawer of the invention for automatically pluggable and unpluggable electronic cards and the support therefor.

In addition to the mother board 3, the third embodiment of the drawer of the invention for automatically pluggable and unpluggable electronic cards includes a second mother board 13, and in addition to the back output connectors 4, 5, it includes lateral connectors 7, 8.

The second mother board 13 lies between the first mother board 3 and the front face 6 of the drawer.

In this third embodiment, the second mother board 13 extends beyond the first mother board 3 on both sides and the free ends of the second mother board 13 are thus free to carry output connectors 7, 8.

The fixed output connectors 8 are secured to the bay 9.

As before, when the drawer is inserted together with daughter cards connected to the first mother board into the bay, the daughter cards are connected to the back output connectors 4 simultaneously with the second mother board 13 being connected to the lateral output connectors 8.

The advantage of the second mother board is to enable electrical signals to be received and transmitted from either side of the second mother board.

Power components 14 can be disposed on the second mother board 13 so as to appear on the front face of the drawer.

The power components are cooled because they are located close to the outside of the drawer.

Cooling of the power components can be improved by means of a cooling device 15, e.g. a radiator, disposed on the power components outside the front face of the drawer.

The advantage of the third embodiment of the drawer for automatically pluggable and unpluggable electronic cards is that it is entirely suitable for power supply circuits, which are generally heavy.

Another advantage of the third embodiment of the drawer for automatically pluggable and unpluggable electronic cards is that its center of gravity is close to the front of the drawer which makes the drawer easier to handle.

Another advantage of the third embodiment of the drawer for automatic pluggable and unpluggable electronic cards is that it makes it possible for the mechanical structure of the front of the drawer to be organized in a manner available to the person skilled in the art, so that the assembly located at the front of the drawer constitutes a single unit that can be removed independently from the remainder of the drawer.

The mother board 3 may have lateral output connectors 7, 8 as described above with reference to FIG. 3 or it may have no such lateral output connectors 7, 8.

FIG. 5 is a plan view of a fourth embodiment of the drawer of the invention for automatically pluggable and unpluggable electronic cards and of the bay therefor.

The fourth embodiment of the drawer of the invention for automatically pluggable and unpluggable electronic cards and the bay therefor are identical to the first embodiment of the drawer of the invention for pluggable and unpluggable electronic cards and the bay therefor.

In addition to the mother board 3, the fourth embodiment of the drawer for automatically pluggable and unpluggable electronic cards also includes a plurality of additional mother boards 13, and in addition to its back output connectors 4, 5, it also includes lateral output connectors 7, 8.

The additional mother boards 13 are disposed between the first mother board 3 and the front face 6 of the drawer.

In this fourth embodiment, a given additional mother board 13 extends beyond both sides of the mother board disposed immediately adjacent thereto and the free ends of the given additional mother board 13 are thus suitable for carrying output connectors 7, 8.

The fixed output connectors 8 are secured to the bay 9.

As before, when the drawer is inserted into the bay with the daughter cards connected to the first mother board, the daughter cards connect to the back output connectors 4 simultaneously with the additional mother boards 13 connecting with the lateral output connectors 8.

The additional mother boards 13 are disposed one above another so as to form an assembly that is generally pyramid shaped, on at least one of its sides.

The mother board 3 may include lateral output connectors 7, 8 as described above with reference to FIG. 3, or it may include no such lateral output connectors 7, 8.

A method of removing electronic cards 2 connected to a mother board 3 stems from the above description, the electronic cards 2 being connected to back output connectors 5.

The electronic cards 2 can be connected to, and disconnected simultaneously from the associated output connectors 4, by simultaneously plugging and unplugging back output connectors 5.

The electronic cards 2 can also be disconnected manually from the back of the mother card 3 by means of the front card connectors 21.

I claim:

1. A drawer for electronic cards, said electronic cards being connected to a mother board by card connectors, and said electronic cards being connected to output connectors, wherein the drawer is automatically pluggable and unpluggable and wherein the following are disposed successively from the back to the front of said drawer:

said output connectors being disposed inside a drawer support and secured to a back face of said drawer support;

said electronic cards being disposed between said output connectors in back and said card connectors in front; and said mother board being disposed forward of said card connectors and close to the front face of said drawer.

2. A drawer according to claim 1, in which said electronic cards, disposed between said output connectors and said card connectors, are suitable for being manually disconnected from the back of said mother board by virtue of the card connectors.

3. A drawer according to claim 1 in combination with a bay, said drawer being suitable for insertion into said bay, wherein said bay includes:

output cabling disposed at a back of said bay; and associated output connectors disposed inside said bay, said associated output connectors being secured to the back of said bay such that said output connectors are automatically pluggable with said associated output connectors upon insertion of said drawer into said bay.

4. A drawer and a bay therefor according to claim 3, in which said electronic cards are connected to, and disconnected from, said output cabling by interaction between said associated output connectors and said output connectors, wherein said associated output connectors and said output connectors face one another such that said electronic cards are disconnected from said associated output connectors simultaneously upon removal of said drawer from said bay.

5. A drawer for electronic cards, wherein the drawer is removably insertable into a bay so as to automatically and simultaneously connect and disconnect the electronic cards from the bay, said drawer comprising:

a drawer support having a back face for insertion into the bay, and a front face opposite to said back face;

output connectors secured to said back face of said drawer support;

electronic cards connected to said output connectors such that said electronic cards are disposed between said output connectors and said front face of said drawer support;

card connectors connected to said electronic cards such that said card connectors are disposed closer to said front face of said drawer support than are said output connectors; and a mother board connected to said card connectors such that said mother board is disposed between said card connectors and said front face of said drawer support.

6. A drawer according to claim 5 in combination with the bay, wherein said bay includes:

a front, a back opposite to said front, and an inside disposed between said front and said back;

output cabling disposed at said back of said bay; and associated output connectors disposed on the inside of said bay, wherein said associated output connectors are secured to said back of said bay so as to be connectable with said output connectors upon insertion of said drawer into said bay.

7. A drawer and bay combination according to claim 6, further including grip means on said front face of said drawer support.

8. A drawer and bay combination according to claim 6, wherein:

said bay further includes fixed lateral output connectors on said front; and said mother board further includes lateral output connectors for connection to said fixed lateral output connectors.

* * * * *